United States Patent
Gaul et al.

[11] Patent Number: 5,448,102
[45] Date of Patent: Sep. 5, 1995

[54] TRENCH ISOLATION STRESS RELIEF

[75] Inventors: Stephen J. Gaul; Donald F. Hemmenway, both of Melbourne, Fla.

[73] Assignee: Harris Corporation, Melbourne, Fla.

[21] Appl. No.: 292,588

[22] Filed: Aug. 18, 1994

Related U.S. Application Data

[63] Continuation of Ser. No. 83,080, Jun. 24, 1993, abandoned.

[51] Int. Cl.$^6$ .................. H01L 21/76; H01L 21/763
[52] U.S. Cl. .................. 257/510; 257/513; 257/520
[58] Field of Search .......... 257/510, 506, 511–513, 257/520, 522, 523, 629, 647

[56] References Cited

U.S. PATENT DOCUMENTS

| | | | |
|---|---|---|---|
| 3,354,360 | 11/1967 | Campagna et al. | 257/513 |
| 4,309,716 | 1/1982 | El-Kareh | 257/511 |
| 5,094,973 | 3/1992 | Pang | 257/374 |
| 5,217,919 | 6/1993 | Gaul et al. | 437/67 |

FOREIGN PATENT DOCUMENTS

| | | | |
|---|---|---|---|
| 0136328 | 7/1985 | Japan | 257/510 |
| 0202033 | 8/1990 | Japan | 257/506 |
| 0263454 | 9/1992 | Japan | 257/510 |

OTHER PUBLICATIONS

Translation of Japan Kokai Publication No. 04-263454 to Mitani et al., Sep. 1992, 9 pages.

*Primary Examiner*—William Mintel
*Assistant Examiner*—Peter Toby Brown
*Attorney, Agent, or Firm*—Nixon, Hargrave, Devans & Doyle

[57] ABSTRACT

In a microelectronic device formed on a substrate 12, a pair of trenches 30, 36 branch at their intersection to provide branches 31–34 surrounding a sacrificial island 42. Sacrificial island 42 may comprise substrate material or other material or a void for absorbing the axial stresses propagated along the lengths of trenches 30, 36.

25 Claims, 2 Drawing Sheets

TRENCH ISOLATION STRESS RELIEF

This application is a continuation of application Ser. No. 08/083,080, filed Jun. 24, 1993 and now abandoned.

BACKGROUND

This invention relates generally to structures and techniques for fabricating and isolating microelectronic devices and, in particular, to microelectronic devices and processes including trench isolation with stress relief.

In the fabrication of microelectronic circuits it is necessary to isolate one or more microelectronic transistors from another. While there are a number of techniques available for providing such isolation, trench isolation is often used for separation between adjacent device islands. Trench isolation involves etching a narrow, deep groove in the substrate, usually silicon. After etching the groove, the inside surface of the groove is usually filled with an oxide or polysilicon, or both.

In a typical trench isolation process, a layer of masking material is deposited or grown on the substrate and etched to form openings defining a pattern of the length and width of a trench. The substrate is then anisotropically etched to remove silicon. After etching is completed a sidewall oxide is grown on the inside surface of the trench and then the trench is filled with polysilicon by deposition and etchback. As a final step, an oxide cap is grown on the trench. The trench masking material is typically removed prior to the growth of the oxide cap or prior to the formation of the sidewall oxide.

The trench is made deep enough to penetrate epitaxial layers in the substrate. This penetration will, in effect, decouple parasitic bipolar transistors that are inherently formed during a CMOS process. Alternatively, the trench may be made deep enough to reach a buried oxide in an SOI material.

As part of a quality assurance program, wafers containing trench isolation were etched to identify any defects associated with trench location. As a result of this investigation, we uncovered, in the worst samples, unusual behavior. In certain samples, device islands were relatively free of defects whereas certain field areas where no devices were formed had high defect concentration.

More specifically, we noticed that in large square islands such as bond pads that contained no diffusions, there were many defects adjacent the trench area, in particular, near the corners of the trench. The field area outside the bond pads had numerous defects some of which emanate from outside corners. In all of the cases, the defects appeared to be aligned with one of the trench lines entering a corner. Indeed, the defects appear to be distributed along an imaginary line that would be a continuation of the trench line.

SUMMARY OF THE INVENTION

We believe that the defects are generated by material in the trenches that expands at different rates from the substrate material. We also believe that the stress generated by this differential expression is cumulative along the length of the trench but small or self-canceling across the width of the trench. In order to overcome this problem and reduce the stresses in the trench and in the substrate, we change the material in the trench at the intersection of two or more trenches in order to relieve the longitudinal stress.

One way of changing the trench material at the intersection of the trenches is to not remove all of the substrate material and leave an island of substrate material, preferably silicon as silicon substrate, that will absorb the longitudinal stress. Another solution to the problem is to leave a void at a trench intersection so that the void will absorb the longitudinal stress. As such, the invention comprises a method for reducing stress in the substrate as well as a novel device having a trench structure that is different from trench structures of the prior art to the extent that a different material or a changed material is provided at the intersection of the two trenches, and in particular, at the corner intersection of two trenches. The invention also provides for relieving stresses in a T-type (three-way) intersection of two trenches as well as a four-way intersection where both trenches continue through the intersection. In another aspect of the invention, stresses along the length of a trench are relieved by providing selected notches in the sidewalls of the trench in order to allow the stress to dissipate in the sidewalls along the length of the trench thereby reducing the cumulative effect of the stress along the length of the trench.

In one embodiment of the method of the invention, a portion of the substrate is removed along an axial direction to provide a first trench. Another portion of the substrate is removed along another axial direction to provide a second trench that intersects the first trench. The trench is refilled with material that creates stress at the intersection of the two trenches. The material at the intersection of the trenches is changed in order to relieve the stress. In one embodiment the change of material is provided by leaving some of the substrate material as an island in the trench. In another embodiment of the invention the refill material in the trench is changed to provide a void at the intersection of the two trenches in order to allow the void to absorb the stress in the trench.

The invention is preferably embodied in a substrate of silicon. Using silicon, islands of silicon are allowed to remain the intersection or tile corners of trenches thereby absorbing the stresses generated by the trench refill material. Alternatively, voids may be provided at the trench intersections.

As mentioned above, trenches generate stresses in particular at corners. These may be either inside corners or outside corners. In the case of an outside corner, the invention provides for expanding the volume of the corner in order to provide extra material at the corner to absorb the longitudinal stress. Alternatively, the corner can be broken or chamfered by providing a third trench between the two trenches entering the corner. This third, interconnecting trench will absorb and redirect some of the longitudinal stresses that build up at the corner. For an inside corner longitudinal stresses are relieved by expanding the radius of the corner into the device area to provide a peninsula of different material which will absorb the longitudinal stresses directed at the corner.

BRIEF DESCRIPTION OF THE DRAWINGS

The above and other embodiments to the invention will be better understood with reference to the following drawings.

DETAILED DESCRIPTION OF THE DRAWINGS

Figure 1:
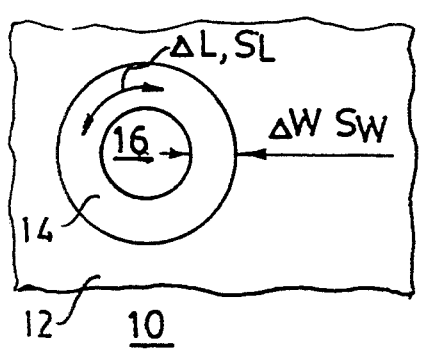
FIG. 1 is a partial plan view of a round island surrounded by a trench.
Figure 2:
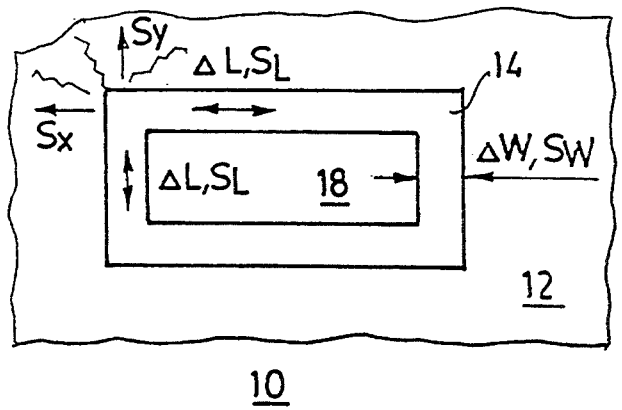
FIG. 2 is a partial plan view of a rectangular island surrounded by a trench.

Turning to FIGS. 1 and 2, there are shown schematic examples of a round island of substrate material 16 surrounded by an annular trench 14 in a substrate 12. In both examples, the substrate 12 is made of silicon and the island 16 is of the same material. However, this technique may be used with other substrate materials including germanium, gallium arsenide, and others. With reference to FIG. 2, a rectangular island 18 of substrate material is shown surrounded by a trench 14 in substrate 12, In a typical trench process the substrate 12 is suitably masked and an opening having a pattern corresponding to the width of the trench is made in the masking layer. The exposed substrate in the area corresponding to the trench width, i.e. 14, is removed or otherwise etched away in a manner well known in the art. Etching is highly directional so that the trench forms a pair of relatively parallel sidewalls and a floor. The sidewalls are spaced apart generally the same distance top to bottom, but in any manufacturing process, this may vary somewhat. In most modern processes, the trench is generally slightly narrower at the bottom of the trench than at the top.

In a typical process used with silicon, the sidewalls of the trench are then oxidized to provide a coating of silicon dioxide and the trench is refilled with polysilicon material usually via low pressure chemical vapor deposition. Thus, the material inside trench. 14 comprises an outer layer of silicon dioxide and an inner material of polysilicon. During further processing of the wafer or substrate 12, the material in the trench experiences alternately heat and cooling. Since the polysilicon in the trench has different grain boundaries from the monocrystalline substrate 12, the material in the trench will expand and contract at rates different from the substrate 12 and the islands 16, 18. Expansion of the trench refill materials along the length of the trench gives rise to a radially directed stress $S_R$ in the round island which tends to compress the silicon outside the island while leaving a tensile stress inside. Expansion along the width of the trench also gives rise to a radially directed stress but this component is compressive both inside and outside the island. As such, the stresses inside the island tend to cancel out or give a low tensile stress. Outside the island the stress components add to one another to yield a highly compressive stress.

For the rectangular island shown in FIG. 2, a similar condition arises. However, the linear expansion $\Delta L$ along the length of the trench concentrates a compressive stress $S_L$ at the outside corners. It is believed that this additive compressive stress along the directions indicated explain the stress tails found in the stress defect etched wafers. Expansion along the width of the trench, $\Delta W$, gives rise to a compressive stress on both sides of the trench. Because of the geometry of the island the stress may not be as reduced inside the island as for round islands. In any event, it appears that the component of stress due to $\Delta W$ is relatively small and does not generate substantial defects.

Figure 3:
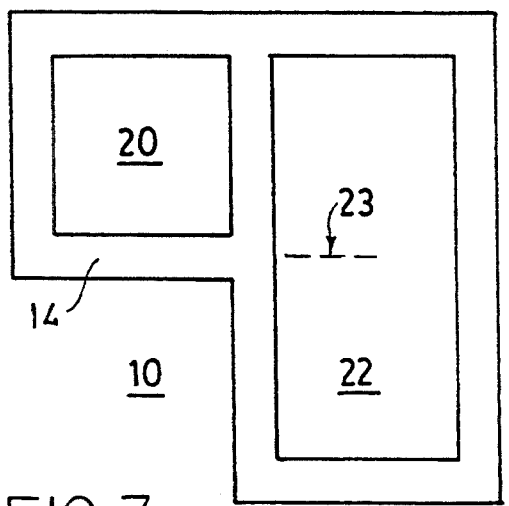
FIG. 3 is a, plan view of two adjoining devices each surrounded by a trench.
Figure 4:
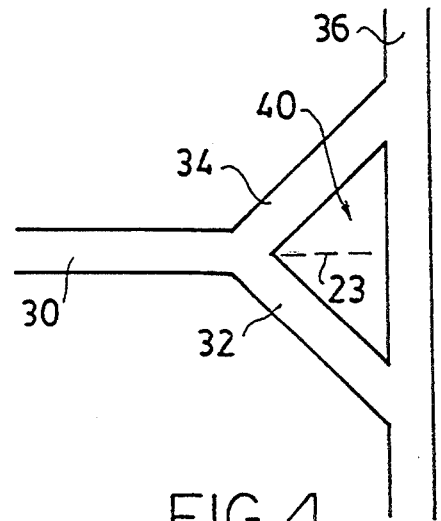
FIG. 4 is a partial plan view of a T-(three-way) intersection of two trenches.

As shown in FIG. 3, defects tend to propagate along a line 23 that appears to be in axial alignment with the trench 14 disposed along the lower edge of device 20. Such propagation of defects 23 into a device 22 is undesirable. This observation coupled with the analysis for the causes of stress given above, led to a solution of the problem as shown in FIG. 4. There, a first trench 30 is shown intersecting a second trench 36. The trench 30 is patterned to diverge at or near the three-way intersection into two branches 32, 34. The branches 32, 34 diverge from each other and join the trench 36 on opposite sides of an island 40. The island 40 is of the same material as the substrate 12, preferably, silicon. In the embodiment shown in FIG. 4, the island 40 acts as a sacrificial island which absorbs the defects 23 that are propagated along the length of the trench 30. As shown in FIG. 4, the island 40 has a generally triangular shape.

Figure 5:
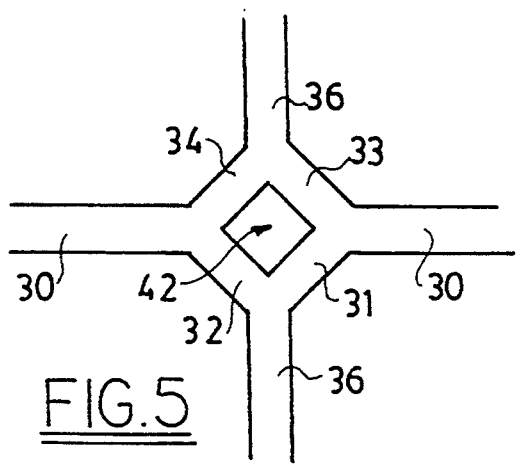
FIG. 5 is a partial plan view of a through (four-way) intersection of two trenches.

The invention may also be used at three or four-way intersections. Turning to FIG. 5, again there are shown trenches 30, 36 which intersect each other and pass through the intersection. As the trenches approach the intersection, they branch off into two Y-shaped branches. Thus, branches 31–34 surround a central island 42 comprised of substrate material. With the embodiment shown in FIG. 5 longitudinal stresses along either trench 30 or 36 are absorbed by the island 42.

Figure 6:
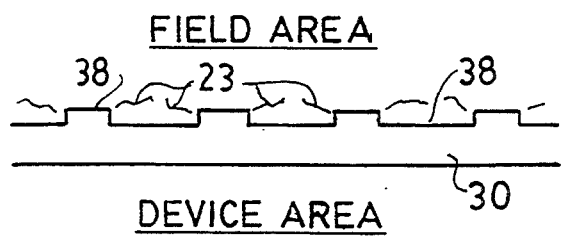
FIG. 6 is a partial plan view of an elongated section of a trench.

With reference to FIG. 6, there is shown a further improvement of the invention. An axially elongated trench 30 has a device area on one side and a field area on the other side of the trench 30. On the side of the trench adjacent the field area the trench is provided with a plurality of notches 38. The notches 38 project and extend the sidewall of the trench 30 into the field area. Hence, lateral stresses that build up along the length of trench 30 may be dissipated by the notches 38 to direct defects 23 into the field areas and away from a device area that lies across the axis of trench 30.

Figure 7:
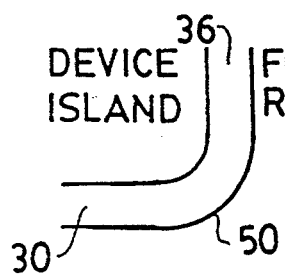
FIG. 7 is a partial plan view of an outside corner trench.
Figure 8:
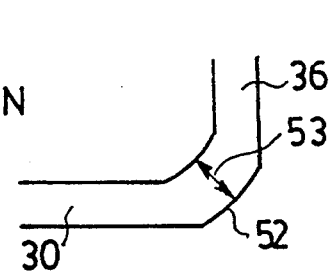
FIGS. 8 and. 9 are partial plan views of outside corners having different embodiments of the invention.
Figure 9:
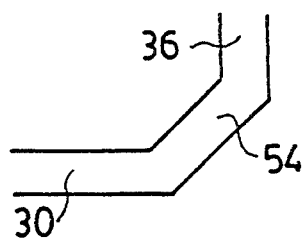

FIG. 7 shows a typical corner where a first trench 30 meets a second trench 36 in a corner 50. As indicated, a device island is on the inside of the corner and a field region is on the outside of the corner. Such corner regions of the device area may also be subject to defects. These defects can be reduced by expanding the corner region 50. In one embodiment of the invention as shown in FIG. 8, the corner 52 has an expanded depth 53 that expands into the field region. This extra depth of the corner helps absorb the stresses. In another embodiment as shown in FIG. 9, the trenches 30, 36 are connected together by another trench portion 54 that is disposed at an obtuse angle to both of the other trenches. As such, the corner is cut by a straight portion 54 that intersects trenches 30, 36 at obtuse angles.

Figure 10:
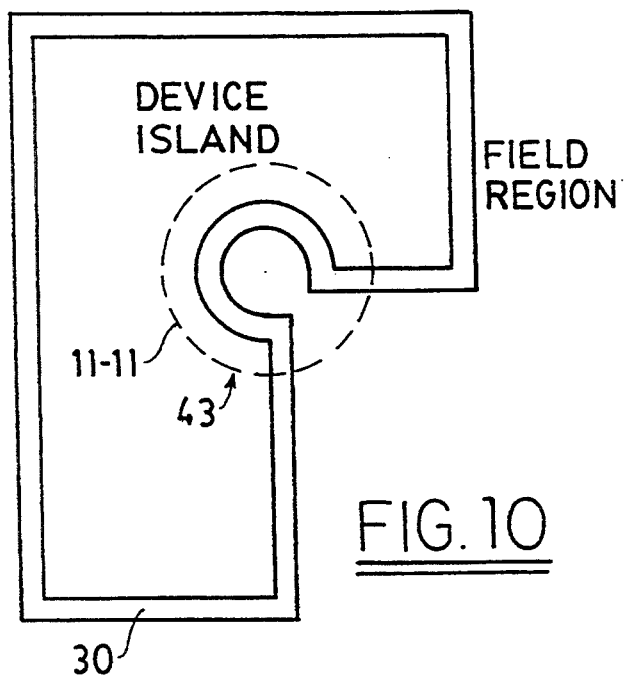
FIG. 10 is a partial plan or view of an inside corner trench.
Figure 11:
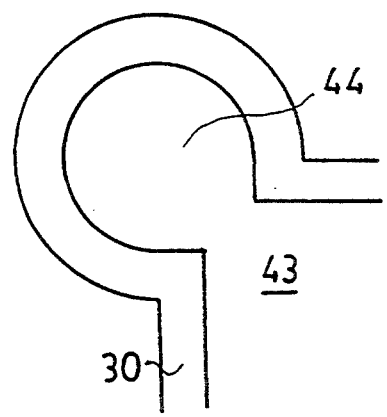
FIG. 11 is a partial enlarged view of a portion of FIG. 10.

Another feature of microelectronic circuits is device islands with inside corners. One such feature is shown in FIG. 10 where the device island has an internal corner region 43. As shown in FIGS. 10 and 11, the trench 30 has an extended rounded portion that defines a peninsula 44 that projects into the device island and is boarded by the trench 30. This rounded portion of the trench and the peninsula 44 are sufficient to dissipate device defects that would propagate along the axial length of trench 30.

Figure 12:
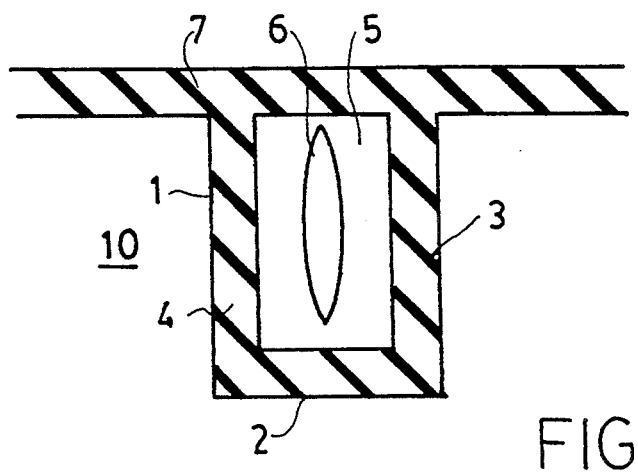
FIG. 12 is a partial sectional view of a trench including one embodiment of the invention.

As mentioned above, it is not only possible to relieve axial stresses by providing sacrificial islands but also by providing selective void areas in lieu of the sacrificial islands. A typical void area is shown in FIG. 12. There, a side profile of the trench 30 is shown having spaced apart sidewalls 1, 3 and a floor portion 2. A layer of insulating material, typically silicon dioxide 4 is disposed on the interior surfaces of the trench walls and floor, 1–3. A trench falling material 5, typically polysilicon, is deposited in the trench 30 by a low pressure chemical vapor deposition process. During deposition, polysilicon 5 will deposit more heavily on the upper portions of walls 1, 3 than on the lower portions. The result of this is that a void 6 is formed through the center of the trench 30 and in the middle of the polysilicon material 5. After the polysilicon is deposited the surface is planarized and a protective coating of silicon dioxide or silicon nitride 7 is applied to the surface of substrate 10. Where this technique is used, it is important that the trench void be closed and not intersect the top of the trench.

Having thus described the preferred embodiments of the invention, those skilled in the art will appreciate that there are other modifications, additions, and changes that can be made to the invention without departing from the spirit and scope as defined in the appended claims. Such modifications and changes include the adaption of the invention to substrates other than silicon including germanium, as well as compound semiconductor materials such as gallium arsenide. Moreover, while the preferred embodiment of the invention describes changing the material at the intersection of the trenches to include substrate material or voids, those skilled in the art will appreciate that other materials could be selectively deposited in the intersections without departing from the spirit and scope of the appended claims.

What we claim is:

1. An integrated circuit comprising:
  a substrate of semiconductor material with device areas comprising microelectronic circuits and microelectronic devices;
  two trenches, each trench having a length extending from one end of the trench to the other end of the trench and a width defined by spaced apart sidewalls, each trench filled with material which generates stress and propagates defects at least in a direction corresponding to the length of the trench;
  said two trenches extending along intersecting paths and defining an intersection where the paths of the two trenches meet;
  sacrificial means without circuits or devices for relieving stress, absorbing the propagated defects, and preventing damage to the device areas, said sacrificial means disposed in at least one of said trenches, disposed at the intersection of said two trenches, transverse to the direction of the stress in said one trench, and extending across the intersection and across the path of said one trench a distance greater than the width of said one trench.

2. The integrated circuit of claim 1 wherein said one trench has one end at the intersection.

3. The integrated circuit of claim 1 wherein the two trenches both continue through the intersection.

4. The integrated circuit of claim 1 wherein said means for relieving stress comprises an island of substrate material, said island having a width wider than said one trench.

5. The integrated circuit of claim 4 wherein the material of the substrate and of the island comprises silicon.

6. The integrated circuit of claim 1 wherein the trenches are filled with material comprising a dielectric and a planarizing material.

7. The integrated circuit of claim 6 wherein the dielectric material is deposited on the sidewalls of the trenches.

8. The integrated circuit of claim 6 wherein the dielectric comprises silicon dioxide.

9. The integrated circuit of claim 6 wherein the planarizing material is polysilicon.

10. An integrated circuit comprising:
  a substrate of monocrystalline silicon having areas including microelectronic circuits and microelectronic devices;
  at least first and second trenches in said substrate, each trench having a pair of spaced apart sidewalls and having internal trench wall and floor surfaces coated with a layer of silicon dioxide and filled with polysilicon, said trenches joining each other at an intersection, said trenches having stress generated in said trenches and oriented in a direction parallel to said sidewalls and toward said intersection and capable of propagating defects in said monocrystalline silicon;
  a sacrificial island of silicon without circuits or devices disposed in the intersection for relieving the stress generated in the trench, absorbing the propagated defects and preventing damage to the areas including microelectronic circuits and microelectronic devices, said island having a width that begins where first trench enters the intersection and increases in width in a direction toward the middle of the intersection where the island is wider than the trench, said sacrificial island being spaced from said areas including said microelectric circuits and microelectronic devices.

11. The integrated circuit of claim 10 wherein said first trench terminates at the intersection and the island of silicon has a triangular shape with one apex oriented toward said first trench and a base of the triangle spaced from the apex, wider than said first trench and located near the middle of the intersection.

12. The integrated circuit of claim 10 wherein both trenches continue through the intersection and the island of silicon has four surfaces that meet to form four apexes, each apex oriented in a direction toward a different one of said trenches for receiving and relieving the stress in said trench directed toward said intersection, said surfaces diverging from said apexes a distance greater than the width of the trench.

13. An integrated circuit comprising:
  a substrate of monocrystalline silicon having areas including microelectronic circuits and microelectronic devices;
  at least first and second trenches in said substrate, each trench having a pair of spaced apart sidewalls and having internal trench wall and floor surfaces coated with a layer of silicon dioxide and filled with polysilicon, said trenches joining each other at an intersection, said trenches having stress generated in said trenches and capable of propagating defects oriented in a direction parallel to said sidewalls and toward said intersection;

a sacrificial island of silicon without circuits or devices disposed in the intersection, said island having at least a pair of surfaces meeting at an apex, said apex oriented in a direction toward at least one of said trenches for receiving and relieving the stress, absorbing the propagated defect and preventing damage to the microelectronic circuits and microelectronic devices, said sacrificial island disposed in said trench directed toward said intersection, said surfaces diverging from said apex a distance greater than the width of the trench.

14. The integrated circuit of claim 13 wherein one trench terminates at the intersection and the island of silicon has a triangular shape.

15. The integrated circuit of claim 13 wherein both trenches continue through the intersection and the island of silicon has four surfaces that meet to form four apexes, each apex oriented in a direction toward a different one of said trenches for receiving and relieving the stress in said trench directed toward said intersection, said surfaces diverging from said apexes a distance greater than the width of the trench.

16. An integrated circuit comprising:
a substrate of semiconductor material with device areas comprising microelectronic circuits and microelectronic devices;

at least first and second trenches, each trench having a length extending from one end of the trench to the other end of the trench and a width defined by spaced apart sidewalls, each trench filled with material which generates stress and propagates defects at least in a direction corresponding to the length of the trench;

said first and second trenches extending along intersecting paths and defining an intersection where the paths of the two trenches meet;

said first trench dividing into two branches at a location before the entry of the first trench into the intersection; and sacrificial means without circuits or devices for relieving stress, absorbing the defects and preventing damage to the device areas, said sacrificial means disposed in at least said first trench, disposed at the intersection of said two trenches and at the location where said first trench divides into two branches.

17. The integrated circuit of claim 16 wherein the branches terminate at the intersection, the second trench continues through the intersection and the means for relieving stress is enclosed by the two branches of the first trench and the second trench.

18. The integrated circuit of claim 16 wherein both trenches continue through the intersection and a plurality of branches interconnect the trenches and surround the means for relieving stress.

19. The integrated circuit of claim 16 wherein the branches are disposed at a predetermined angle.

20. The integrated circuit of claim 16 wherein the means for relieving stress comprises a pillar of substrate material having a triangular shape.

21. The integrated circuit of claim 16 wherein the means for relieving stress comprises a pillar of substrate material having a diamond shape.

22. The integrated circuit of claim 16 wherein at least a portion of the means for relieving stress is wider than said first trench.

23. An integrated circuit comprising:
a substrate of monocrystalline silicon having areas including microelectronic circuits and microelectronic devices;

at least first and second trenches in said substrate, each trench having a pair of spaced apart sidewalls and having internal trench wall and floor surfaces coated with a layer of silicon dioxide and filled with polysilicon, said trenches joining each other at an intersection, said trenches having stress generated in said trenches and oriented in a direction parallel to said sidewalls and toward said intersection and capable of propagating defects in said monocrystalline silicon;

a sacrificial island of silicon disposed in the intersection for relieving the stress generated in the trench, absorbing the propagated defects and preventing damage to the areas including microelectronic circuits and microelectronic devices, said island having a width that begins where first trench enters the intersection and increases in width in a direction toward the middle of the intersection where the island is wider than the trench, said sacrificial island being spaced from said areas including said microelectric circuits and microelectronic devices, wherein said first trench terminates at the intersection and the island of silicon has a triangular shape with one apex oriented toward said first trench and a base of the triangle spaced from the apex, wider than said first trench and located near the middle of the intersection.

24. An integrated circuit comprising:
a substrate of monocrystalline silicon having areas including microelectronic circuits and microelectronic devices;

at least first and second trenches in said substrate, each trench having a pair of spaced apart sidewalls and having internal trench wall and floor surfaces coated with a layer of silicon dioxide and filled with polysilicon, said trenches joining each other at an intersection, said trenches having stress generated in said trenches and capable of propagating defects oriented in a direction parallel to said sidewalls and toward said intersection;

a sacrificial island of silicon disposed in the intersection, said island having at least a pair of surfaces meeting at an apex, said apex oriented in a direction toward at least one of said trenches for receiving and relieving the stress, absorbing the propagated defect and preventing damage to the microelectronic circuits and microelectronic devices, said sacrificial island disposed in said trench directed toward said intersection, said surfaces diverging from said apex a distance greater than the width of the trench, wherein one trench terminates at the intersection and the island of silicon has a triangular shape.

25. An integrated circuit comprising:
a substrate of semiconductor material with device areas comprising microelectronic circuits and microelectronic devices;

at least first and second trenches, each trench having a length extending from one end of the trench to the other end of the trench and a width defined by spaced apart sidewalls, each trench filled with material which generates stress and propagates defects at least in a direction corresponding to the length of the trench;

said first and second trenches extending along intersecting paths and defining an intersection where the paths of the two trenches meet;

said first trench dividing into two branches at a location near the entry of the first trench into the intersection; and sacrificial means for relieving stress, absorbing the defects and preventing damage to the device areas, said sacrificial means disposed in at least said first trench, disposed at the intersection of said two trenches and at the location where said first trench divides into two branches, wherein the means for relieving stress comprises a pillar of substrate material having a diamond shape.

* * * * *